United States Patent
Bian

(10) Patent No.: US 9,111,931 B2
(45) Date of Patent: Aug. 18, 2015

(54) METHOD OF FORMING AN INTERCONNECT STRUCTURE WITH HIGH PROCESS MARGINS

(71) Applicant: NANYA TECHNOLOGY CORPORATION, Tao-Yuan Hsien (TW)

(72) Inventor: Zai Long Bian, Boise, ID (US)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 14/161,500

(22) Filed: Jan. 22, 2014

(65) Prior Publication Data

US 2015/0206836 A1 Jul. 23, 2015

(51) Int. Cl.
*H01L 23/522* (2006.01)
*H01L 21/768* (2006.01)

(52) U.S. Cl.
CPC ...... *H01L 23/5226* (2013.01); *H01L 21/76877* (2013.01); *H01L 21/76897* (2013.01)

(58) Field of Classification Search
CPC ................... H01L 21/7681; H01L 2224/05006
See application file for complete search history.

(56) References Cited

U.S. PATENT DOCUMENTS

| | | | |
|---|---|---|---|
| 6,573,604 B1* | 6/2003 | Kajita | 257/758 |
| 6,777,323 B2* | 8/2004 | Kakamu | 438/633 |
| 2002/0173158 A1* | 11/2002 | Jeng | 438/706 |
| 2003/0183939 A1* | 10/2003 | Kakamu et al. | 257/762 |
| 2004/0175929 A1* | 9/2004 | Schmitt et al. | 438/628 |

* cited by examiner

*Primary Examiner* — Lex Malsawma
(74) *Attorney, Agent, or Firm* — WPAT, P.C.; Anthony King

(57) ABSTRACT

A method of forming an interconnect structure with high process margin. The present invention provides higher aligning margin for the connection of via parts and line parts. The method for forming the interconnect structure includes the steps of: forming a first mask layer with a plurality of first openings over the first insulating layer; forming a second insulating layer over the mask layer; forming a second mask layer with a plurality of second openings over the second insulating layer; performing an etching process by using the second mask layer to form a plurality of cavities penetrating through the second insulating layer, the first mask layer, and the first insulating layer; and filling the plurality of cavities with at least one conductive material.

12 Claims, 4 Drawing Sheets

METHOD OF FORMING AN INTERCONNECT STRUCTURE WITH HIGH PROCESS MARGINS

BACKGROUND

1. Technical Field

The present disclosure relates to an interconnect structure and the method for preparing the same. More particularly, the invention is related to an interconnect structure and the method for preparing the same with high process margins.

2. Description of Related Arts

It is a common requirement for Cu-based back-end-of-line (BEOL) stacks to make electrical connections with high aspect ratio tungsten contacts in front-end-of-line (FEOL) processes. As semiconductor devices are made, the interconnection electrically links the devices and conductive line parts together. There are via parts and line parts that form an interconnected structure. The via parts are usually filled with tungsten and the method of deposition is highly developed. The line parts are usually filled with copper, which has high conductivity, low resistance, and is able to prevent electron migration. As devices continue to minimize, the formation of the deep tungsten contacts becomes more and more difficult because of poor etch profiles and a high risk of under etching. Moreover, the alignment margin between the tight pitched copper line and the tungsten via continues to get smaller, and thus causes a higher risk of short-circuiting.

When comparing the present invention to a conventional dual damascene, the present invention has several advantages. In general, the conventional dual damascene requires two steps of dielectric etching: one is for via parts and the other is for trench parts. The conventional dual damascene also derives two pattern processes and two alignment processes. Since the conventional dual damascene comprises such parts and processes, the alignment of the via parts and line parts becomes increasingly difficult due to the minimization of devices. One of the advantages of the present invention is that it requires one less critical alignment step than the conventional dual damascene since a plurality of via holes are self-aligned to a plurality of trenches, which serves as a conducting wire and effectively reduces the risk of short-circuiting and increases the process margin, as shown in FIG. 4. Another advantage of the present invention is that it only requires one dielectric etching process to form the plurality of trenches and the plurality of via holes as opposed to the conventional dual damascene, which requires two dielectric etching processes for the via and the trenches. Another advantage of the present invention is that it does not require WCMP, while the conventional dual damascene needs twice the amount of CMPs for the via and the trenches. In FIGS. 5 and 6, an etching back process for removing a first conductive material on an upper surface of a second insulating layer is performed rather than a tungsten CMP (WCMP) process, which has a high cost and brings about dishing and erosion. Additionally, the line height of the conventional dual damascene is not easy to control in the two dielectric etching processes. The present invention alleviates this issue by allowing line height control with an etch stop layer. The height of the plurality of via holes is defined by the height from a mask layer to the top of the substrate.

In comparison with an all-copper dual damascene, there are a few advantages when utilizing the present invention. The all-copper dual damascene includes via parts and line parts, and both are filled with copper. It can become very challenging for conventional Cu-based processing since a PVD barrier and seed layers are typically needed, which may not have sufficient step coverage inside deep, high aspect ratio vias and also suffers from a phenomenon called "bread loafing" near the opening of the trench, thus leading to copper void formation. The present invention resolves this challenge for copper deposition by filling the plurality of via holes with tungsten and applying a first mask layer, thereby reducing the aspect ratio of the copper metallization that needs to be filled. Due to high aspect ratio holes, the contact structures below the copper interconnects may develop keyholes, which are common in deep contacts. When copper interconnects are directly formed on top of deep contacts with keyholes, copper atoms may penetrate through the contacts and degrade the device performance or suffer from reliability loss. The present invention resolves this issue since it has more reliable tungsten via part separating the copper interconnects from the deep contacts in the substrate that are prone to keyhole formation.

SUMMARY

The present invention provides an interconnect structure and the method for preparing the same. It is important for the Cu-based BEOL stacks to make electrical connections to the high aspect ratio tungsten contacts in the FEOL processes. The present invention provides a higher aligning margin for the connections of via parts and line parts. The risk of short-circuiting may be decreased and the process margin may be increased. The method for forming the interconnect structure comprises the steps of: forming a first mask layer with a plurality of first openings over the first insulating layer; forming a second insulating layer over the mask layer; forming a second mask layer with a plurality of second openings over the second insulating layer; performing an etching process by using the second mask layer to form a plurality of cavities penetrating through the second insulating layer, the first mask layer, and the first insulating layer; and filling the plurality of cavities with at least one conductive material.

The advantage of the present invention is that of having one less critical alignment step than the conventional dual damascene since the plurality of via holes are self-aligned to the plurality of trenches, which serve as a conducting wire.

The present invention provides some economical benefits such as having only one dielectric etch process as opposed to the conventional dual damascene which requires two dielectric etching processes for the via and the trenches, and the present invention does not require a WCMP process, which has a high cost and brings about dishing and erosion. Furthermore, the present invention is able to block penetrating copper atoms by filling the plurality of via holes with tungsten and applying a first mask layer. As such, the present invention does not need copper barrier layers or copper seed layers to deposit into deep and high aspect ratio vias. In addition, since the present invention has reliable electric performance, it is able to prevent copper voids from forming in the interconnect since the plurality of via holes are already filled with a first conductive material.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

The present disclosure is directed to a method of forming reliable contacts with a high process margin. In order to make the present disclosure completely comprehensible, detailed steps and structures are provided in the following description.

Figure 1:
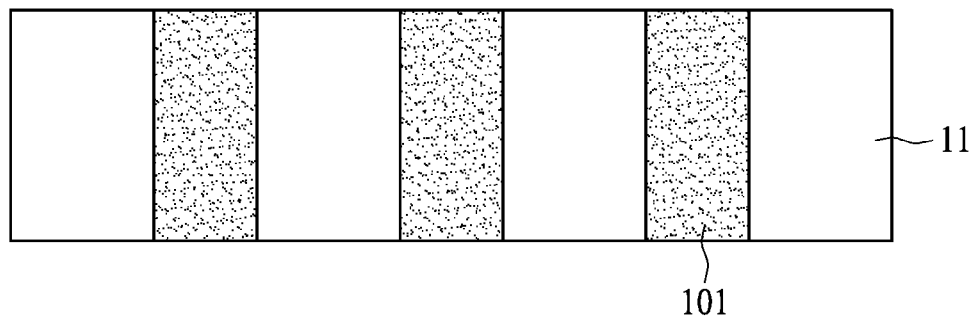
FIG. 1 illustrates that a substrate with a plurality of high aspect ratio contact holes.
Figure 2:
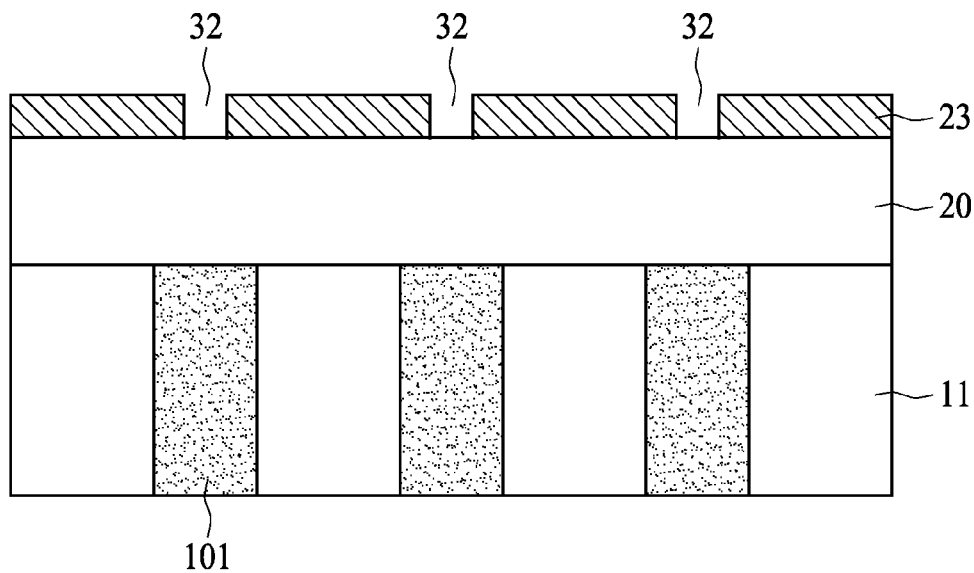
FIG. 2 illustrates that the deposition of a first insulating layer over the substrate and a first mask layer with a plurality of first openings (vias) situated over the first insulating layer.

FIG. 1 is a substrate 11 with a plurality of contacts 101. Under the plurality of contacts 101, there may be a plurality of devices or MOSFETs electrically connected with the plurality of contacts 101. The plurality of contacts 101 are filled with metal, for example, tungsten. The tungsten contact holes are formed by front-end-of-line processing, and upper parts of the substrate 11 are further planarized by a tungsten chemical mechanical polishing (WCMP) process. FIG. 2 depicts the deposition of a first insulating layer 20. The first insulating layer 20 is deposited by a chemical vapor deposit (CVD) or a physical vapor deposit (PVD). The first insulating layer 20 includes silicon oxide or silicon dioxide. After the deposition of the first insulating layer 20, a first mask layer 23 is deposited by CVD or PVD. The first mask layer 23 includes silicon nitride or other suitable materials. Afterward, the first mask layer 23 is patterned to form a plurality of first openings 32. The plurality of first openings 32 are used as alignments for a plurality of via holes 30 and a plurality of trenches 31. The first mask layer 23 blocks error etching and produces a higher alignment margin. The height of the plurality of via holes 30 is defined by the height from the first mask layer 23 to the top of the substrate 11.

Figure 3:
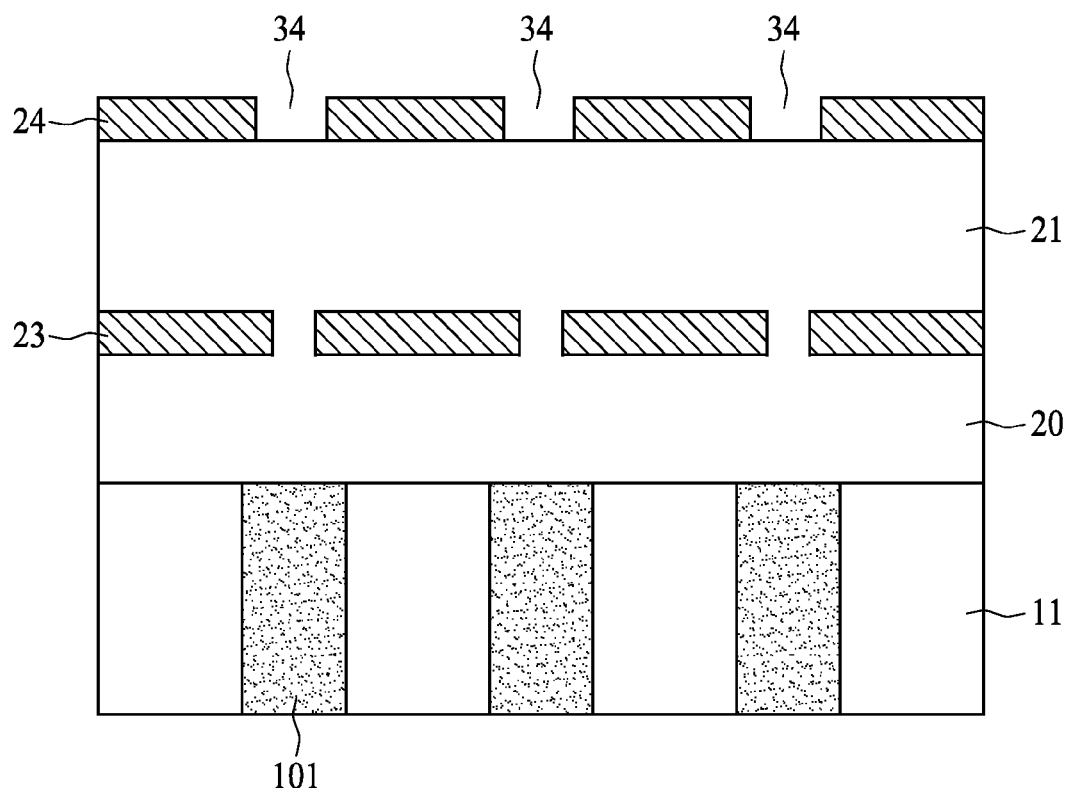
FIG. 3 illustrates that a second insulating layer is formed over the first mask layer and a second mask layer with a plurality of second openings (trenches) is formed over the second insulating layer.
Figure 4:
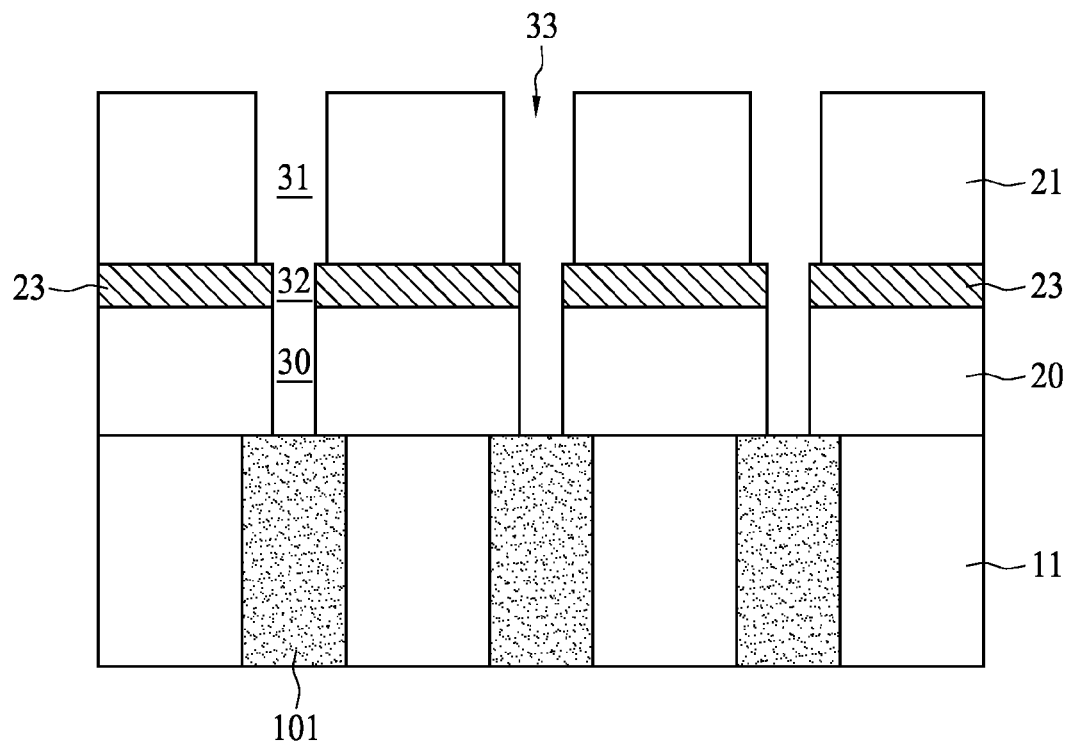
FIG. 4 illustrates that an etching process is preformed by using the second mask layer to form a plurality of cavities penetrating through the second insulating layer, the plurality of first openings in the first mask layer, and the first insulating layer.

FIG. 3 depicts a second insulating layer 21 formed over the first mask layer 23. The second insulating layer 21 includes silicon oxide or silicon dioxide. After the deposition of the second insulating layer 21, a second mask layer 24 is deposited over the second insulating layer 21. The second mask layer 24 includes a photoresist. Then the second mask layer 24 is patterned to form a plurality of second openings 34 which aligns with the plurality of first openings 32. The plurality of second openings 34 may be larger than the plurality of first openings 32. In addition, the plurality of second openings 34 do not need to be perfectly centered over the plurality of first openings 32 but generally encompass the plurality of first openings 32 entirely. FIG. 4 depicts an etching process preformed by using the second mask layer 24 to form a plurality of cavities 33 penetrating through the second insulating layer 21, the plurality of first openings 32 in the first mask layer 23, and the first insulating layer 20. The etching process is continuously penetrating through the second insulating layer 21 and the first insulating layer 20 until the top of the substrate 11 is reached. Once the etching process is complete, the plurality of cavities 33 are formed. Each of the plurality of cavities 33 includes a via hole 30 in the first insulating layer 20, a first opening 32 in the first mask layer 32, and a plurality of trenches 31 in the second insulating layer 21. The plurality of via holes 30 are self-aligned with the plurality of trenches 31, and the width of the plurality of via holes 30 is substantially the same as the width of the plurality of trenches 31. Furthermore, the height of the plurality of via holes 30, which can be modulated, is defined by the height from the first mask layer 23 to the top of the substrate 11. The first mask layer 23 blocks error etching and produces a higher alignment margin. After the etching process, the second mask layer 24 is stripped.

Figure 5:
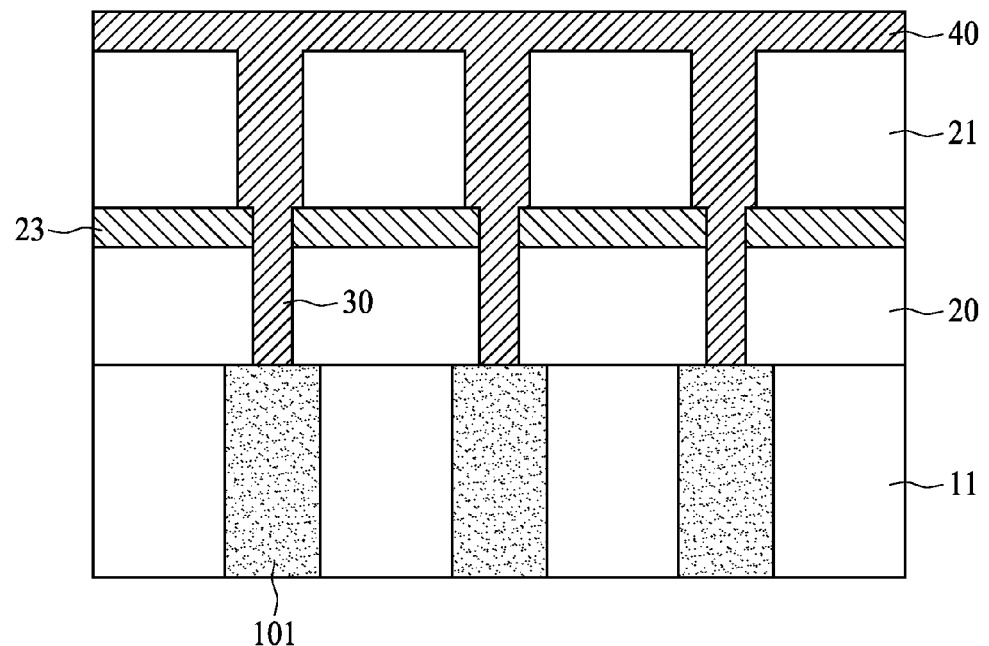
FIG. 5 illustrates that the plurality of cavities and an upper surface of the second insulating layer are filled up with a first conductive material.

FIG. 5 illustrates filling a plurality of cavities 33 and covering an upper surface of the second insulating layer 21 with a first conductive material 40. The first conductive material 40 includes tungsten. The step may be performed by using CVD with a tungsten base process, for example, CVD TiN and CVD W.

Figure 6:
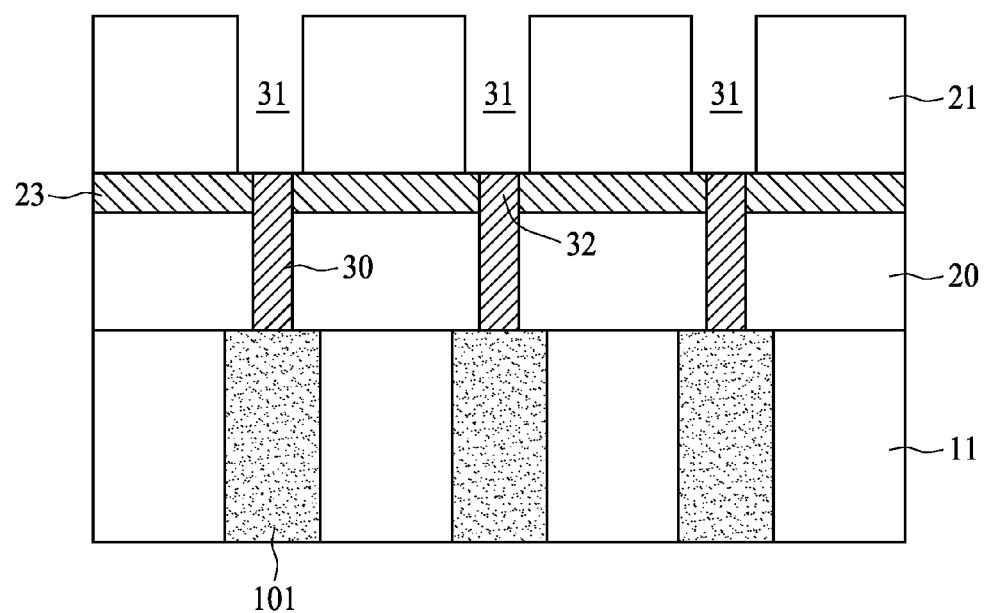
FIG. 6 illustrates that the first conductive material on an upper surface of the second insulating layer, and the plurality of cavities are recessed so that the first conductive material inside the plurality of trenches are partially or completely removed.

FIG. 6 shows the first conductive material 40 on an upper surface of the second insulating layer 21 and in the plurality of cavities 33 are recessed so that the first conductive material 40 inside the plurality of trenches 31 are partially or completely removed. In this step, the first conductive material 40 in the plurality of trenches 31 are etched back so that the first conductive material 40 inside the plurality of trenches 31 are partially or completely removed. Since the first conductive material 40 includes tungsten, the etching back process is a dry etching process with an etching gas, including NF3/Ar, which has excellent selectivity to silicon nitride and silicon oxide. In one embodiment, the typical etching condition is 250° C., 0.8 torr, 50 sccm NF3, 800 sccm Ar, and 900 W RF with 13.56 MHz. After the etching back process, the first conductive material 40 inside the plurality of trenches 31 is removed and the plurality of via holes 30 are still filled with the first conductive material 40.

Figure 7:
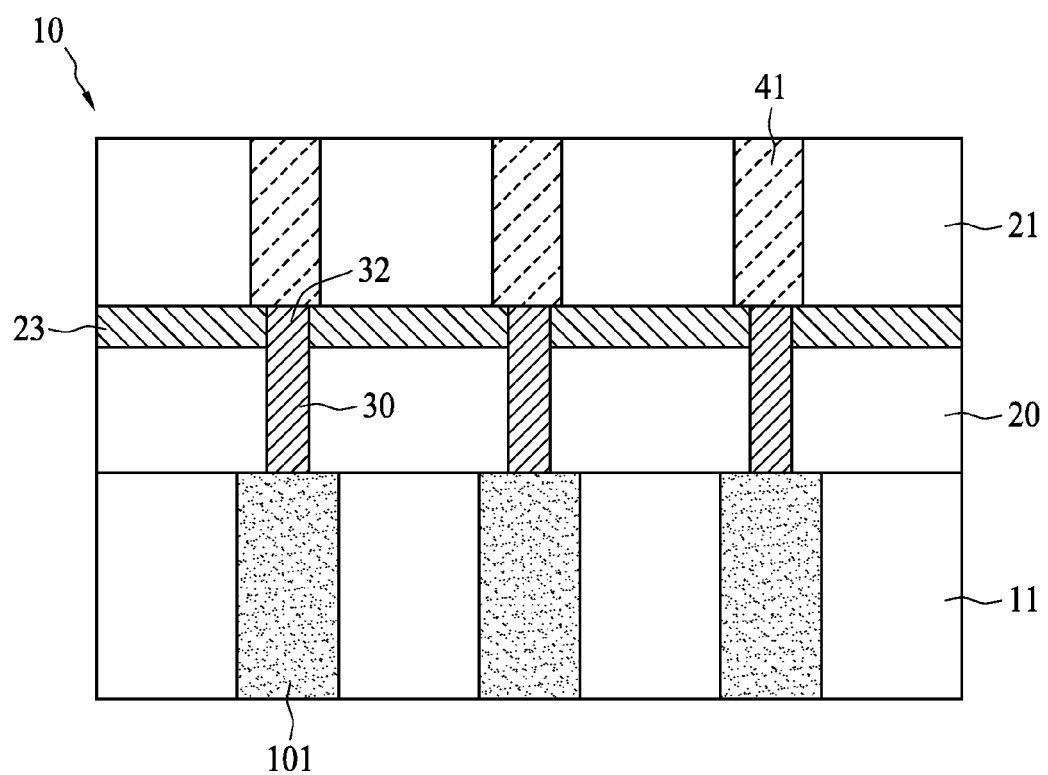
FIG. 7 illustrates that the plurality of trenches are filled with the second conductive material.

FIG. 7 depicts the plurality of trenches 31 filled with the second conductive material 41. The second conductive material 41 includes copper. The plurality of trenches 31 that are filled with copper serve as a conducting wire. Thus the mixture structure for fabricating reliable contacts with high process margins is accomplished. Referring back to FIG. 6, the first conductive material 40 may be recessed to below the first mask layer 23, and the second conductive material 41 may fill the plurality of trenches 31 and a top portion of the plurality of via holes 30.

The etching process is preformed by using the second mask layer 24 to form a plurality of cavities 33 penetrating through the second insulating layer 21, the plurality of first openings 32 in the first mask layer 23, and the first insulating layer 20 until the top of the substrate 11 is reached.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An interconnect structure, comprising:
    a substrate;
    a first insulating layer disposed over the substrate, wherein the first insulating layer has a plurality of via holes filled with a first conductive material;
    a second insulating layer disposed over the first insulating layer, wherein the second insulating layer has a plurality of trenches filled with a second conductive material without the first conductive material;
    a first mask layer disposed between the first insulating layer and the second insulating layer, wherein the first mask layer has a plurality of openings connecting the plurality of via holes and the plurality of trenches; and
    wherein the plurality of via holes are self-aligned with the plurality of trenches.

2. The interconnect structure of claim 1, wherein the substrate comprises a plurality of contacts coupled with the plurality of via holes.

3. The interconnect structure of claim 1, wherein the first conductive material comprises tungsten.

4. The interconnect structure of claim 1, wherein the second conductive material comprises copper.

5. The interconnect structure of claim 1, wherein the first insulating layer comprises silicon dioxide or silicon oxide.

6. The interconnect structure of claim 1, wherein the second insulating layer comprises silicon dioxide or silicon oxide.

7. The interconnect structure of claim 1, wherein the height of the plurality of via holes is defined by the height from a top of the substrate to a bottom of the first mask layer.

8. The interconnect structure of claim 1, wherein the first mask layer comprises silicon nitride.

9. A method of forming an interconnect structure, comprising the steps of:
    providing a substrate;
    forming a first insulating layer over the substrate;
    forming a first mask layer with a plurality of first openings over the first insulating layer;
    forming a second insulating layer over the mask layer;
    forming a second mask layer with a plurality of second openings over the second insulating layer;
    performing an etching process by using the second mask layer to form a plurality of cavities penetrating through the second insulating layer, the first mask layer, and the first insulating layer, wherein each of the plurality of cavities comprises a via hole in the first insulating layer, a first opening in the first mask layer, and a trench in the second insulating layer;
    filling the plurality of cavities with a first conductive material;
    etching back the first conductive material in the plurality of trenches so that the first conductive material inside the plurality of trenches is removed; and
    filling the plurality of trenches with a second conductive material without the first conductive material.

10. The method of claim 9, wherein filling the plurality of cavities with the first conductive material further comprising covering an upper surface of the second insulating layer with the first conductive material.

11. The method of claim 9, wherein the etching back process is a dry etching process with an etching gas, including NF3/Ar.

12. A method of forming an interconnect structure, comprising the steps of:
    providing a substrate;
    forming a first insulating layer over the substrate;
    forming a first mask layer with a plurality of first openings over the first insulating layer;
    forming a second insulating layer over the mask layer;
    forming a second mask layer with a plurality of second openings over the second insulating layer;
    performing an etching process by using the second mask layer to form a plurality of cavities penetrating through the second insulating layer, the first mask layer, and the first insulating layer, wherein each of the plurality of cavities comprises a via hole in the first insulating layer, a first opening in the first mask layer, and a trench in the second insulating layer;
    filling the plurality of via holes with a first conductive material; and
    filling the plurality of trenches with a second conductive material without the first conductive material.

* * * * *